(12) United States Patent
Kim et al.

(10) Patent No.: US 8,426,935 B2
(45) Date of Patent: Apr. 23, 2013

(54) ELECTRONIC DEVICE, MEMORY DEVICE, AND METHOD OF FABRICATING THE SAME

(75) Inventors: Gyu Tae Kim, Gwangmyeong-si (KR); Kang Ho Lee, Gunpo-si (KR); Hye Young Kim, Seoul (KR); Kyung Jin Lee, Seoul (KR); Woun Kang, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 329 days.

(21) Appl. No.: 12/700,464

(22) Filed: Feb. 4, 2010

(65) Prior Publication Data

US 2011/0101476 A1    May 5, 2011

(30) Foreign Application Priority Data

Oct. 29, 2009    (KR) .................. 10-2009-00103567

(51) Int. Cl.
*H01L 29/82*    (2006.01)
*H01L 21/02*    (2006.01)

(52) U.S. Cl.
USPC ............. 257/421; 257/E21.002; 257/E29.323

(58) Field of Classification Search .................. None
See application file for complete search history.

(56) References Cited

U.S. PATENT DOCUMENTS

2008/0290460 A1* 11/2008 Iseki et al. .................... 257/536
2010/0258639 A1* 10/2010 Florek et al. .................. 235/492

* cited by examiner

*Primary Examiner* — Mamadou Diallo
(74) *Attorney, Agent, or Firm* — Buchanan Ingersoll & Rooney PC

(57) ABSTRACT

Provided are an electronic device, a memory device, and a method of fabricating the devices for preventing physical distortion of functional elements from generating and improving electric contact properties between the functional elements and electric elements connecting to the functional elements. At least two grooves are formed in a substrate, and a conductive material is filled in the grooves to obtain electric elements having a surface at the same height as that of the substrate. In addition, a functional material layer (functional layer) is formed on an entire upper surface of the substrate and is patterned so as to obtain a functional element having both bottom surfaces contacting the electric elements.

9 Claims, 7 Drawing Sheets

ELECTRONIC DEVICE, MEMORY DEVICE, AND METHOD OF FABRICATING THE SAME

CROSS-REFERENCE TO RELATED PATENT APPLICATION

This application claims the benefit of Korean Patent Application No. 10-2009-0103567, filed on Oct. 29, 2009, in the Korean Intellectual Property Office, the disclosure of which is incorporated herein in its entirety by reference.

BACKGROUND OF THE INVENTION

1. Field of the Invention

The present invention relates to an electronic device, a memory device, and a method of fabricating the electronic device and the memory device.

2. Description of the Related Art

In electronic devices, an oxide film is actively used as an insulating material, however, in some cases, the oxide film is an unnecessary element that is to be removed. A material that is easily oxidized may be inevitably used in some electronic devices. The above material is treated in a vacuum atmosphere of rare oxygen, for example, a vacuum deposition method may be used to grow layers. However, during fabricating electronic devices, an oxide film may be inevitably formed due to exposure to the air. The oxide film performs as an electrical barrier between electric elements and interrupts with flow of electric current, and the above operation of the oxide film largely affects the electronic device as a size of the device becomes smaller. Moreover, the oxide film may cause a rectifying operation in a nano-scale structure device.

In order to address the above problems, the oxide film is removed by an etching process such as an ion milling right before forming other electric elements, and then, a membrane is formed as a continuous process without being withdrawn out of a vacuum chamber. However, according to the above processes, equipment that may successively perform the etching operation and the deposition is necessary, and the above equipment is much more expensive than separate etching equipment and the deposition equipment and costs high processing prices. In addition, before performing the etching process, a thickness of the oxide film should be precisely recognized in order to minimize damage in the material of the device. The above complex processes causing high costs become a burden in researching and developing electronic devices.

SUMMARY OF THE INVENTION

The present invention provides a method of fabricating an electronic device, which may prevent an electrical contact property between electronic elements from being degraded due to forming of an oxide film.

The present invention also provides a method of fabricating an electronic device, which prevents a physical non-planar structure of an upper material layer from forming due to an irregular surface of lower stacked structure.

According to an aspect of the present invention, there is provided a method of fabricating an electronic device, the method including: forming grooves of a predetermined pattern in a surface of a substrate; forming first material layers by filling a first electronic material in the grooves; and forming a second material layer of a predetermined pattern by using a second electronic material that is oxidized easier than the first electronic material, so as to contact the first material layers on the substrate.

The first material layer may be a conductive material, and the second material may be a ferromagnetic material.

The forming of the first material layers may be performed so that surfaces of the first material layers are substantially constant with the surface of the substrate.

The second material layer may have a straight and flat structure having no irregularity on an outer portion of the second material layer.

The forming of the grooves may include forming at least a pair of grooves facing each other, and the forming of the first material layers may include filling the first material in the pair of grooves.

The forming of the grooves may include: forming a mask layer having openings corresponding to the grooves on the substrate; and etching the surface of the substrate, which is exposed by the openings, to a predetermined depth.

The forming of the mask layer may include forming a mask material layer on the substrate; and removing portions of the mask material layer, which correspond to the openings.

The removing of the portions corresponding to the openings may include exposing and developing the mask material layer in a photolithography method, an electron beam lithography method, or an ion beam lithography method.

The forming of the first material layers may include: forming a sacrificial layer having openings corresponding to the grooves; depositing the first electronic material on the sacrificial layer and the grooves of the substrate exposed by the openings of the sacrificial layer; and removing the sacrificial layer to obtain the first material layers formed of the first electronic material in the grooves.

According to another aspect of the present invention, there is provided an electronic device including: a substrate including grooves on a surface of the substrate; first material layers formed in the grooves; and a second material layer formed on the substrate so as to contact the first material layers, and formed of a material that is oxidized easier than the first material layers.

The plurality of grooves may be formed in the substrate, and sides of a bottom surface of the second material layer may contact the first material layers in the neighboring two grooves.

Surfaces of the first material layers may be at the same height as the surface of the substrate.

The first material layers may be electrodes, and the second material layer may be a ferromagnetic layer.

The second material layer may have flat bottom surface and upper surface.

According to another aspect of the present invention, there is provided a memory device including the electronic device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
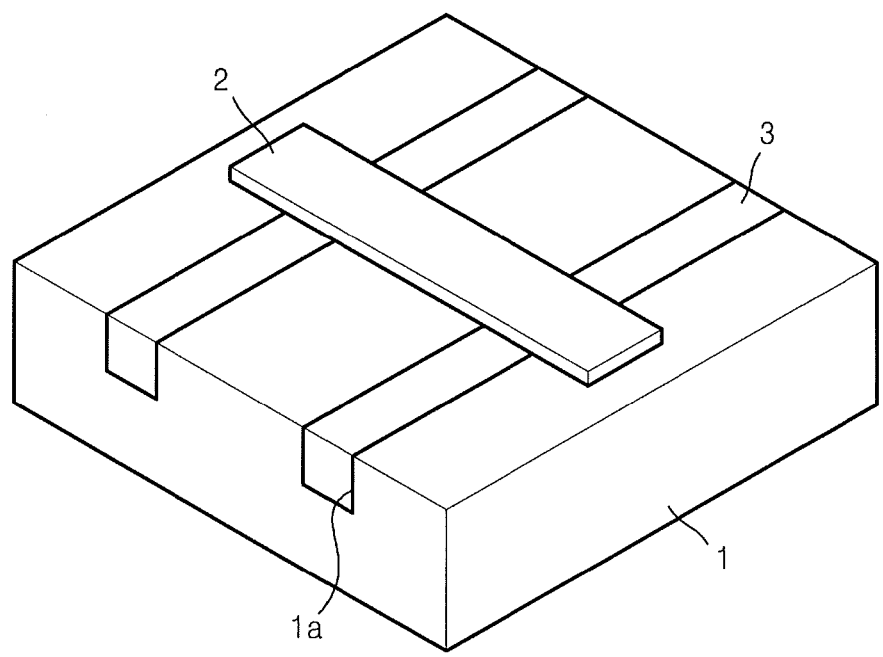
FIG. 1 is a schematic perspective view of an electronic device according to an embodiment of the present invention.

FIG. 1 shows a basic structure of an electronic device according to an embodiment of the present invention.

The electronic device of the present embodiment includes a substrate 1 and a functional layer 2 formed on the substrate 1. The functional layer 2 has both ends, lower portions of which contact two electrodes 3 that are buried in grooves 1a of the substrate 1. The two electrodes 3 may be formed of a high conductive material that is hardly oxidized, for example, gold (Au).

The functional layer 2 may perform various functions, for example, controlling of electric current or recording of information, as well as providing of electric path. In the above structure, the functional layer 2 may inevitably include a material that is highly oxidized, for example, iron (Fe), due to its own functions. In detail, the functional layer 2 may include a ferromagnetic material, for example, Permalloy. Besides, a material that is oxidized when it is exposed to the air may be used to form the functional layer 2. Since the functional layer 2 performs a specialized function, as well as the function of providing the electric path, the functional layer 2 may include an easily oxidized material that is weak against oxygen when it is exposed to the air. The easily oxidized material is combined with oxygen easily when it is exposed to the air so that a thin oxide film may be formed on the material. When the oxide film is located on a moving path of electrons, it may interrupt with the movement of the electrons. The interruption becomes severe when the electronic device becomes fine, and as described above, the oxide film may cause a rectifying operation.

However, according to the electronic device of the present embodiment, that is, when the functional layer 2 is located on the electrodes 3 as shown in FIG. 1, the oxidation of the functional layer 2 does not occur when forming the functional layer 2 in the vacuum chamber, and the electrodes 3 and the functional layer 2 directly contact each other. That is, the functional layer 2 that is easily oxidized is formed on the electrodes 3, and accordingly, the functional layer 2 is formed in a post-process of forming the electrodes 3, and thus, exposure of the functional layer 2 that will contact the electrodes 3 to the air is prevented.

Since the functional layer 2 is formed on a flat surface of the substrate 1, an upper surface and a bottom surface of the functional layer 2 are flat. The flatness of the functional layer 2 is an important factor in a magnetic memory device in which a magnetic domain wall is necessary to move. That is, the functional layer 2 that is not flat interrupts with a flow in the movement of the magnetic domain wall. Therefore, according to the structural property of the electronic device in the present embodiment, the electrodes 3 are buried in the substrate, and accordingly, the surface on which the functional layer 2 is formed, that is, the surfaces of the electrodes 3 and the surface of the substrate 1 are substantially consistent. Therefore, the upper and bottom surfaces of the functional layer 2 may be completely flat.

The complete flat shape of the functional layer may be applied to the functional layer formed of another material in addition to the magnetic material.

Hereinafter, processes of fabricating the electronic device according to an embodiment of the present invention will be described. Following descriptions are about the fabrication of the electronic device shown in FIG. 1 for the convenience sake, however, embodiments of the present invention are not limited thereto.

Figure 2A:
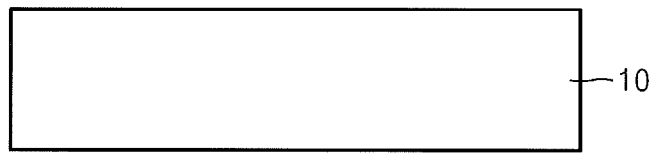
FIGS. 2A through 2Q are cross-sectional views illustrating processes of fabricating an electronic device, according to an embodiment of the present invention.

As shown in FIG. 2A, a substrate 10 is prepared. The substrate 10 may be a silicon (Si) substrate (wafer).

Figure 2B:
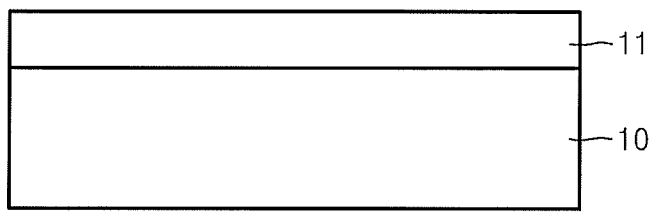

As shown in FIG. 2B, a resist 11 is coated on a surface of the substrate 10 to form a mask layer 11. In this process, a general spin coater may be used to form the mask layer 11. The resist is sensitive to light or electron beam, and may be selected according to a method of forming latent images.

Figure 2C:
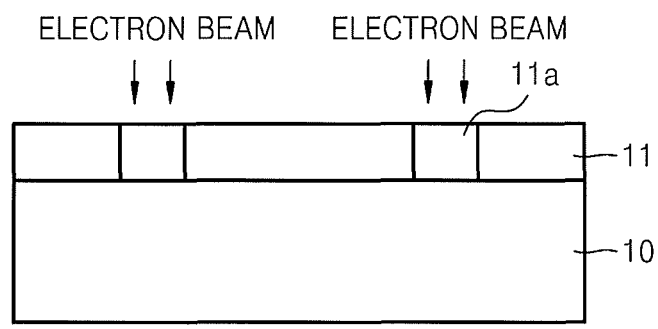

Referring to FIG. 2C, the mask layer 11 is exposed. Regions 11a that are exposed correspond to the grooves 1a that are described above. The exposure process may be performed by a photolithography method, an electron beam lithography, or a focused ion beam lithography method.

Figure 2D:
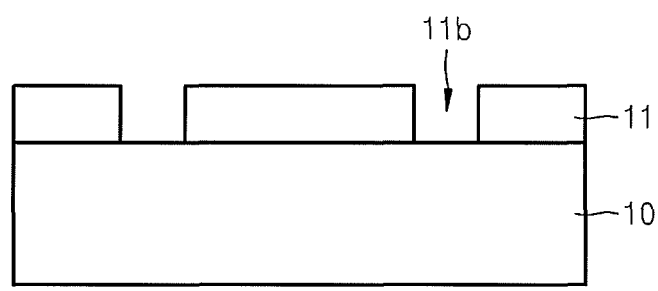

Referring to FIG. 2D, the exposed regions 11a of the mask layer 11 are developed by an etchant to form openings 11b that correspond to the grooves 1a.

Figure 2E:
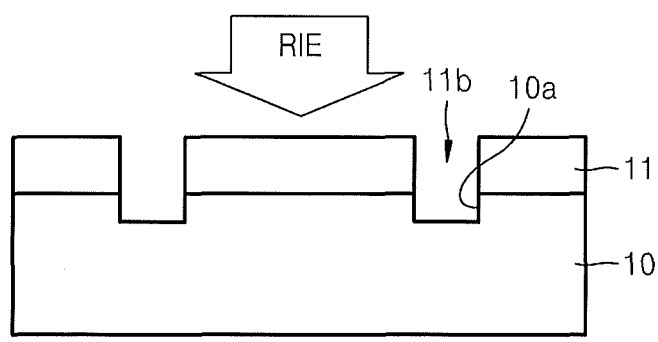

Referring to FIG. 2E, exposed portions of the substrate 10 are etched via the openings 11b of the mask layer 11 to form grooves 10a. At this time, the etching may be performed by a wet etching method using an etchant or a dry etching method such as a reactive ion etching (RIE).

Figure 2F:
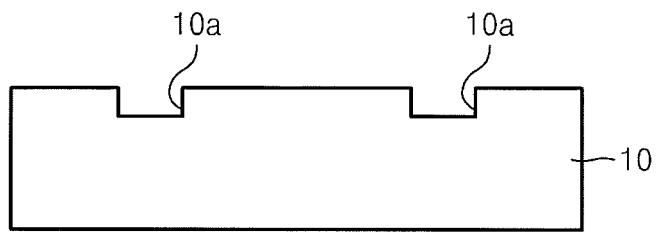

Referring to FIG. 2F, the mask layer 11 is removed, and then, the substrate 10 having the grooves 10a that are formed by the etching operation is obtained.

Figure 2G:
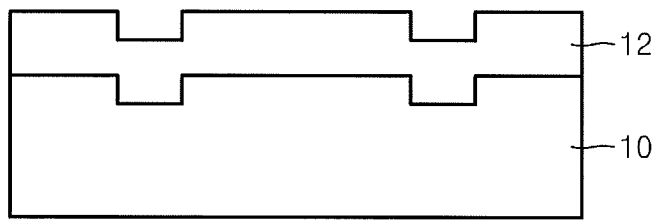

As shown in FIG. 2G, a resist is coated on the surface of the substrate 10 to form a sacrificial layer 12.

Figure 2H:
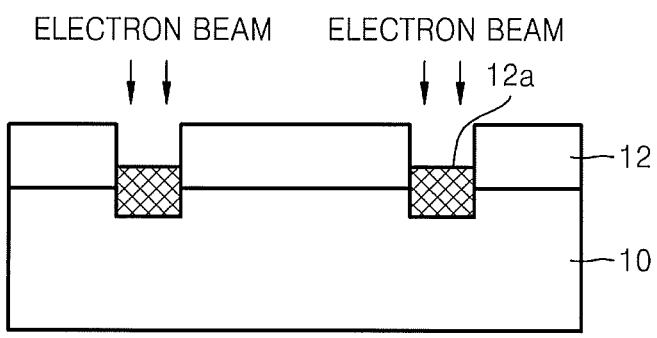

As shown in FIG. 2H, portions 12a of the sacrificial layer 12, which correspond to the grooves 10a of the substrate 10 are exposed.

Figure 2I:
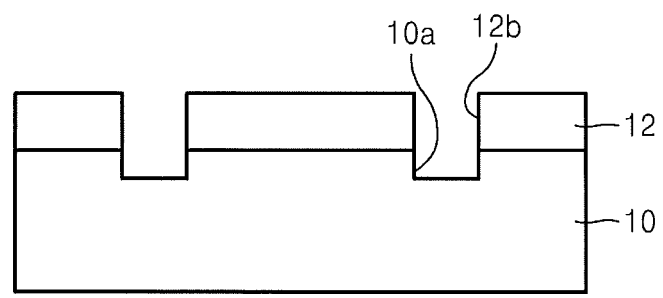

Referring to FIG. 2I, the sacrificial layer 12 is developed to remove the exposed portions 12a, and then, openings 12b connecting to the grooves 10a are formed.

Figure 2J:
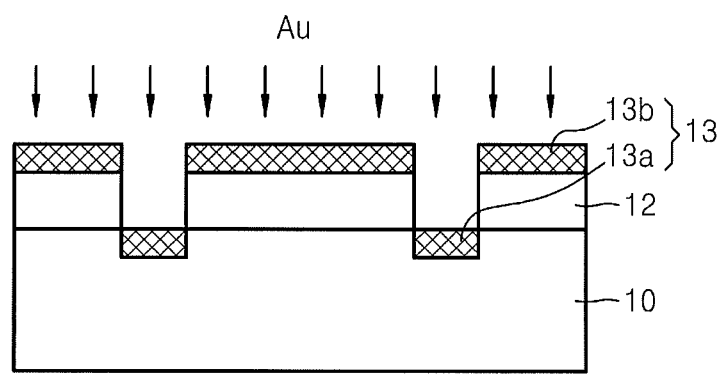

Referring to FIG. 2J, a first electronic material, for example, Au, is deposited to form a first electronic material layer 13. The first electronic material layer 13 includes a first material layer 13a filled in the grooves 10a and a second material layer 13b formed on the surface of the sacrificial layer 12. Here, the first electronic material layer 13 is deposited to a thickness that is the same as the depth of the grooves 10a, and thus, a surface of the first material layer 13a in the grooves 10a may be located at the same height as that of the surface of the substrate 10. The thickness may be adjusted through repeated experiments.

Figure 2K:
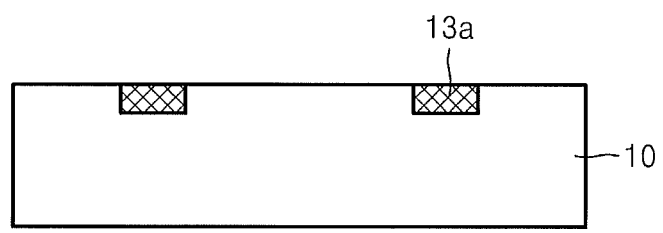

As shown in FIG. 2K, the sacrificial layer 12 and the first material layer 13b are removed by a lift-off method, and then, the first material layer 13a filled in the grooves 10a is obtained. The first material layer 13a in the grooves 10a corresponds to the electrodes 3.

Figure 2L:
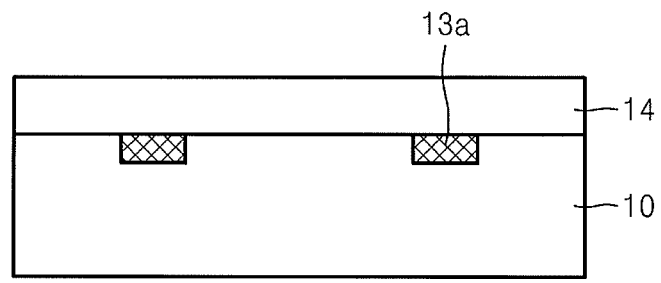

As shown in FIG. 2L, a sacrificial layer 14 covering the substrate 10 is formed by spin-coating resist on the substrate 10.

Figure 2M:
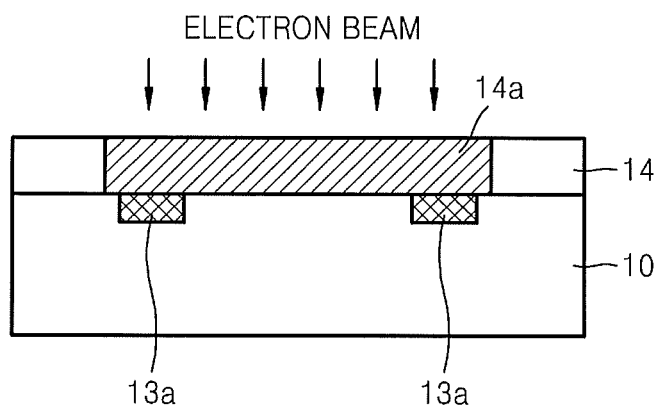

As shown in FIG. 2M, a part 14a of the sacrificial layer 14 is exposed. The exposed portion 14a of the sacrificial layer 14 correspond to the functional layer 2 described above, and thus, the portion commonly covering the first material layers 13a is exposed.

Figure 2N:
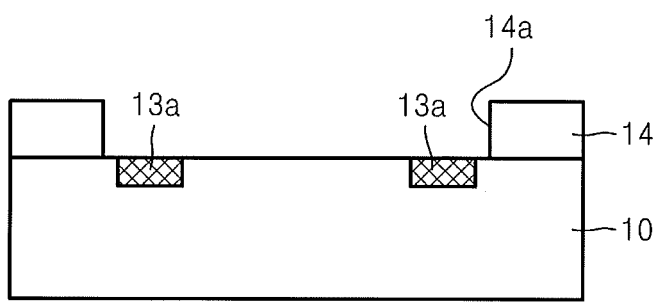

As shown in FIG. 2N, the exposed part 14a of the sacrificial layer 14 is removed to obtain an opening 14b corresponding to the shape of the functional layer 2. Thus, surfaces of the first material layers 13a that are buried in the grooves 10a of the substrate 10 are exposed on a bottom of the opening 14b.

Figure 2O:
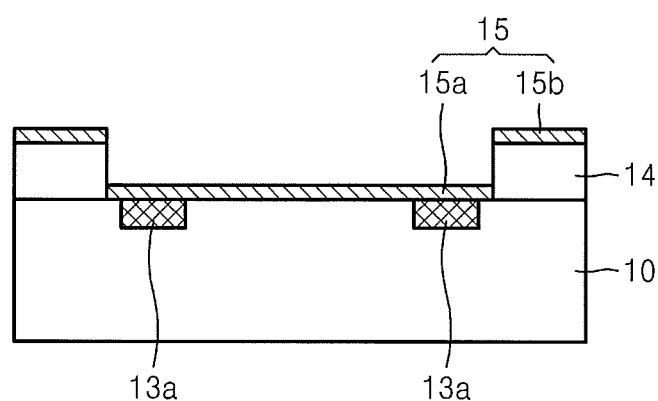

As shown in FIG. 2O, a second electronic material layer 15 is formed on a surface of the sacrificial layer 14 and surfaces of the substrate 10 and the first material layers 13a, which are exposed through the opening 14b. The second electronic material may be permalloy, that is, an alloy of nickel (Ni) and Fe. The second electronic material layer 15 includes a second material layer 15a formed on the surfaces of the substrate 10 and the first material layers 13a, and a second material layer 15b formed on the sacrificial layer 14. The second electronic material layer 15 is deposited in a vacuum chamber with rare oxygen, and thus, oxidation does not occur during depositing the second electronic material layer 15. Therefore, an oxide film does not exist between the second material layer 15a in the opening 14a and the first material layers 13a under the second material layer 15a.

Figure 2P:
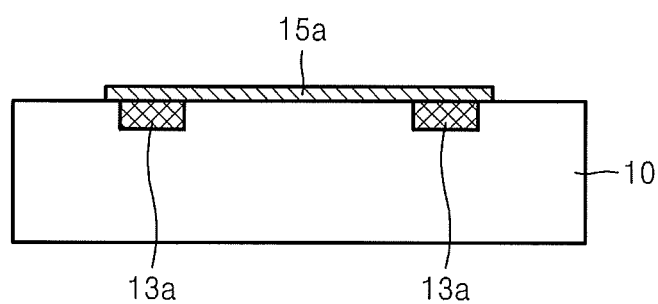
Figure 2Q:
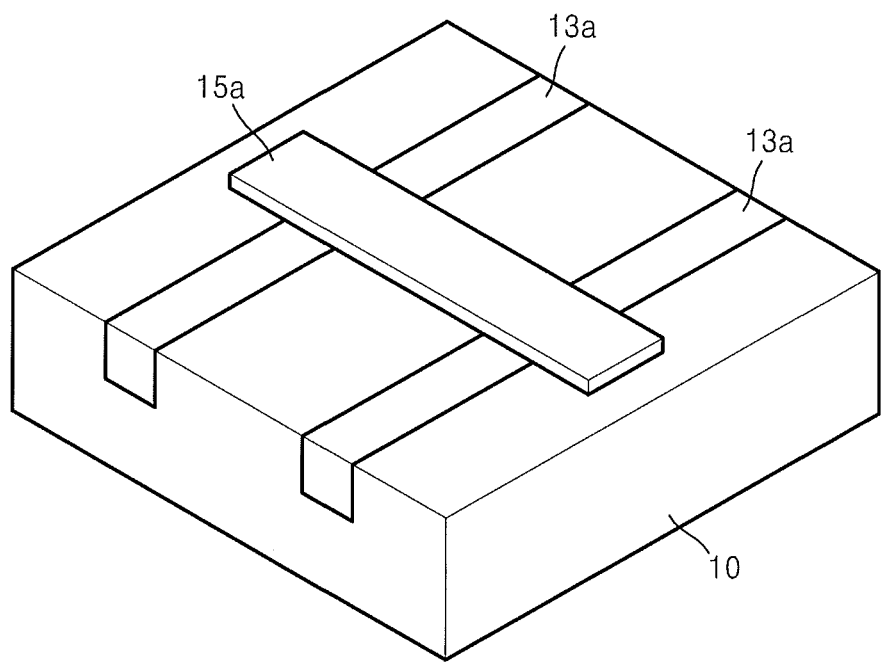

As shown in FIG. 2P, the sacrificial layer 14 and the second material layer 15b on the sacrificial layer 14 are removed by the lift-off method, and then, the electronic device shown in FIG. 2Q is obtained. As shown in FIGS. 2P and 2Q, the second material layer 15a performs as the above described functional layer 2.

After depositing the second electronic material layer 15 through the above processes, the second electronic material layer 15 may be exposed to the air while the process goes to the lift-off process of the substrate 10, and then, an oxide film may be formed on the surface of the second electronic material layer 15. However, the first material layers 13a and the second material layer 15a are tightly attached to each other already, and thus, the oxide film is not formed between the first and second material layers 13a and 15a. Therefore, an interface interrupting with the flow of electrons does not generate between the first and second material layers 13a and 15a.

According to the method of fabricating the electronic device, the generation of oxide film between the first material layer and the second material layer is restrained or prevented. That is, the first material layer that is rarely oxidized is formed first, and the second material layer that is easily oxidized is formed on the first layer. Thus, even when the material layer that is easily oxidized is exposed to the air, the contact area between the second material layer and the first material layer may be protected from the air. The protection is caused by the structural property, in which the easily oxidized material layer is located on an upper portion of the stacked structure including the two material layers that are electrically/physically connected to each other.

The electronic device and the method of fabricating the electronic device of the embodiments of the present invention may be applied to various fields. For example, the embodiments of the present invention may be applied to a spin memory device using a domain wall motion (Magnetic Race-Track Memory: Current Induced Domain Wall Motion) that was suggested by S.S. Parkin group. That is, the embodiments of the present invention may be applied to a memory device, in which a domain wall is formed on a ferromagnetic body (second material layer), under which an electrode (first material layer) is formed, and an electric current is induced through the electrode (first material layer) to move the domain wall of the second material layer (or functional layer) formed of the ferromagnetic material.

According to the conventional art, the electrode is formed on the ferromagnetic substance, and thus, the ferromagnetic substance is exposed to the air during forming the electrode, and then, an unnecessary oxide film is generated. Thus, the oxide film is removed before forming the electrode. However, in order to remove the oxide film without damaging the ferromagnetic substance, very fine etch profile is necessary. Moreover, when the ferromagnetic substance is withdrawn from the vacuum chamber after the etching process, the oxidation occurs again, and thus, equipment for forming the electrode in-situ after the etching process is necessary. The above equipment increases the fabrication costs, which degrades efficiency in the research. On the other hand, the material layer that is easily oxidized may be protected by a capping layer, however, the capping layer of excellent quality is necessary, and thus, expensive equipment for forming the capping layer is required. However, according to the embodiments of the present invention, the material layer that is easily oxidized is formed after forming the electrode, and thus, the above problems may be addressed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating an electronic device having a pair of electrodes and a functional layer positioned between the electrodes and providing a current path between the electrodes, the method comprising:
    forming a pair of grooves in a surface of a substrate;
    forming a pair first material layers for the pair of electrodes by filling a first electronic material in the pair of the grooves; and
    forming a second material layer for the functional layer between the pair of the electrodes by using a second electronic material that is oxidized easier than the first electronic material, so as to contact the first material layers on the substrate,
    wherein the first material layer is a conductive material, and the second material is a ferromagnetic material.

2. The method of claim 1, wherein the forming of the first material layers is performed so that surfaces of the first material layers are substantially constant with the surface of the substrate.

3. The method of claim 1, wherein the forming of the first material layers is performed so that surfaces of the first material layers are substantially constant with the surface of the substrate.

4. The method of claim 1, wherein the second material layer has a straight and flat structure having no irregularity on an outer portion of the second material layer.

5. The method of claim 1, wherein the forming of the pair of grooves comprises forming the pair of grooves facing each other.

6. The method of claim 1, wherein the forming of the pair of grooves comprises:
    forming a mask layer having openings corresponding to the grooves on the substrate; and
    etching the surface of the substrate, which is exposed by the openings, to a predetermined depth.

7. The method of claim 1, wherein the forming of the first material layers comprises:
    forming a sacrificial layer having openings corresponding to the grooves;
    depositing the first electronic material on the sacrificial layer and the grooves of the substrate exposed by the openings of the sacrificial layer; and
    removing the sacrificial layer to obtain the first material layers formed of the first electronic material in the grooves.

8. A method of fabricating a memory device comprising the method of fabricating the electronic device according to claim 1.

9. A method of fabricating a memory device comprising the method of fabricating the electronic device according to claim 2.

* * * * *